US008987658B2

(12) United States Patent
Earman et al.

(10) Patent No.: US 8,987,658 B2
(45) Date of Patent: Mar. 24, 2015

(54) PACKAGED LIGHT DETECTOR SEMICONDUCTOR DEVICES WITH NON-IMAGING OPTICAL CONCENTRATORS FOR AMBIENT LIGHT AND/OR OPTICAL PROXMITY SENSING, METHODS FOR MANUFACTURING THE SAME, AND SYSTEMS INCLUDING THE SAME

(71) Applicant: Intersil Americas LLC, Milpitas, CA (US)

(72) Inventors: Allen M. Earman, Santa Clara, CA (US); Lynn K. Wiese, Santa Clara, CA (US)

(73) Assignee: Intersil Americas LLC, Milpitas, CA (US)

(*) Notice: Subject to any disclaimer, the term of this patent is extended or adjusted under 35 U.S.C. 154(b) by 199 days.

(21) Appl. No.: 13/716,842

(22) Filed: Dec. 17, 2012

(65) Prior Publication Data
US 2014/0145069 A1    May 29, 2014

Related U.S. Application Data

(60) Provisional application No. 61/730,692, filed on Nov. 28, 2012.

(51) Int. Cl.
H01L 31/0203    (2014.01)
H01L 31/0232    (2014.01)
H01L 31/18      (2006.01)
H03K 17/94      (2006.01)
G01J 1/42       (2006.01)
G01J 1/04       (2006.01)

(52) U.S. Cl.
CPC ...... H01L 31/1876 (2013.01); H01L 31/02327 (2013.01); H01L 31/18 (2013.01);
(Continued)

(58) Field of Classification Search
CPC .............. H04N 5/2252–5/2254; G01J 1/04; G01J 1/0271; G01J 1/0407; G01J 1/0422; G01S 17/026; H01L 25/165; H01L 25/167; H01L 33/62; H01L 33/486; H01L 33/483; H01L 33/60; H01L 33/52–33/56; H01L 27/14618; H01L 27/14629; H01L 31/0203; H01L 31/02327; G02B 6/4246; G02B 6/4251; G02B 6/4253; G02B 6/4255; G02B 6/4257; G02B 6/4261; G01L 27/14685
USPC ........ 250/239, 216, 214.1, 208.1, 221, 203.4; 257/290–294, 431–435, 80–85; 359/853
See application file for complete search history.

(56) References Cited

U.S. PATENT DOCUMENTS 5,357,101 A * 10/1994 Plesko .......................... 250/216
(Continued)

OTHER PUBLICATIONS

Lambda Research Corporation, "Compound Parabolic Concentrator", http://www.genuineholographics.com/, TracePro, [printed from Internet, Oct. 2012].

Primary Examiner — Georgia Y Epps
Assistant Examiner — Carolynn A Moore
(74) Attorney, Agent, or Firm — Vierra Magen Marcus LLP

(57) ABSTRACT

Packaged light detector semiconductor devices (PLDSDs), methods for manufacturing PLDSDs, and systems including a PLDSD are described herein. In an embodiment, a PLDSD includes a light detector die having a surface including an active photosensor region, and a non-imaging optical concentrator including an entrance aperture and an exit aperture axially aligned with one another and with the active photosensor region. A molding material forms the non-imaging optical concentrator and encapsulates at least a portion of the surface of the light detector die that extends beyond the exit aperture of the non-imaging optical concentrator. The non-imaging optical concentrator concentrates light from the entrance aperture toward the exit aperture and onto the active photosensor region. In certain embodiments, a reflective material is disposed on an inner surface of the non-imaging optical concentrator, and a light transmissive molding material fills at least a portion of an inner volume of the non-imaging optical concentrator.

20 Claims, 12 Drawing Sheets

(52) U.S. Cl.
CPC ............ *H03K 17/941* (2013.01); *G01J 1/4204* (2013.01); *H01L 31/0203* (2013.01); *G01J 1/0403* (2013.01); *G01J 1/0422* (2013.01)
USPC .......................................... 250/239; 250/216

(56) References Cited

U.S. PATENT DOCUMENTS

| | | |
|---|---|---|
| 6,653,551 B2 | 11/2003 | Chen |
| 7,525,126 B2 | 4/2009 | Leatherdale et al. |
| 7,976,205 B2 | 7/2011 | Grotsch et al. |
| 8,564,012 B2 * | 10/2013 | Ankireddi et al. ............ 257/100 |
| 2008/0144150 A1 | 6/2008 | Champion et al. |
| 2009/0021181 A1 | 1/2009 | Brune et al. |
| 2010/0073748 A1 | 3/2010 | Holmes et al. |
| 2010/0237383 A1 * | 9/2010 | Lai .................. 257/99 |
| 2011/0080533 A1 | 4/2011 | Champion et al. |
| 2012/0170002 A1 | 7/2012 | Ouderkirk et al. |
| 2013/0001409 A1 * | 1/2013 | Tsukagoshi et al. .......... 250/226 |
| 2013/0341650 A1 * | 12/2013 | Peng ............................... 257/82 |

* cited by examiner

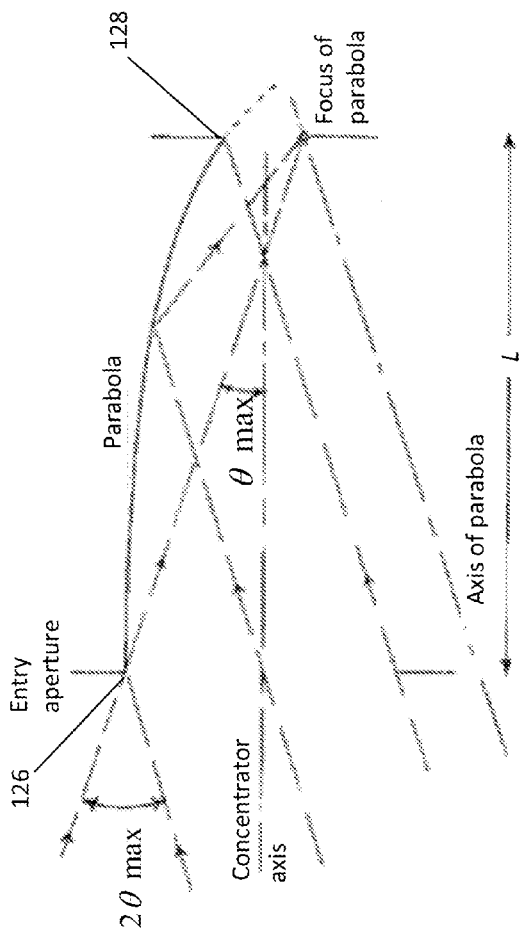
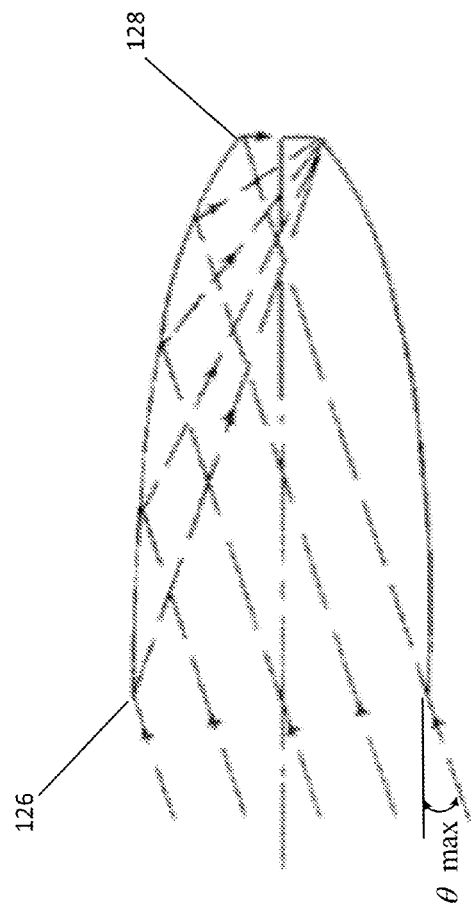
FIG. 2A
FIG. 2B

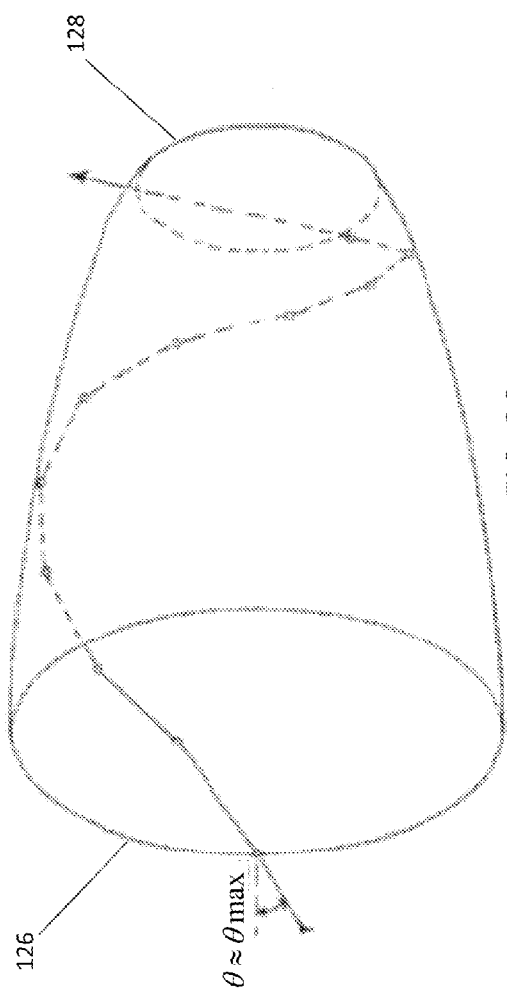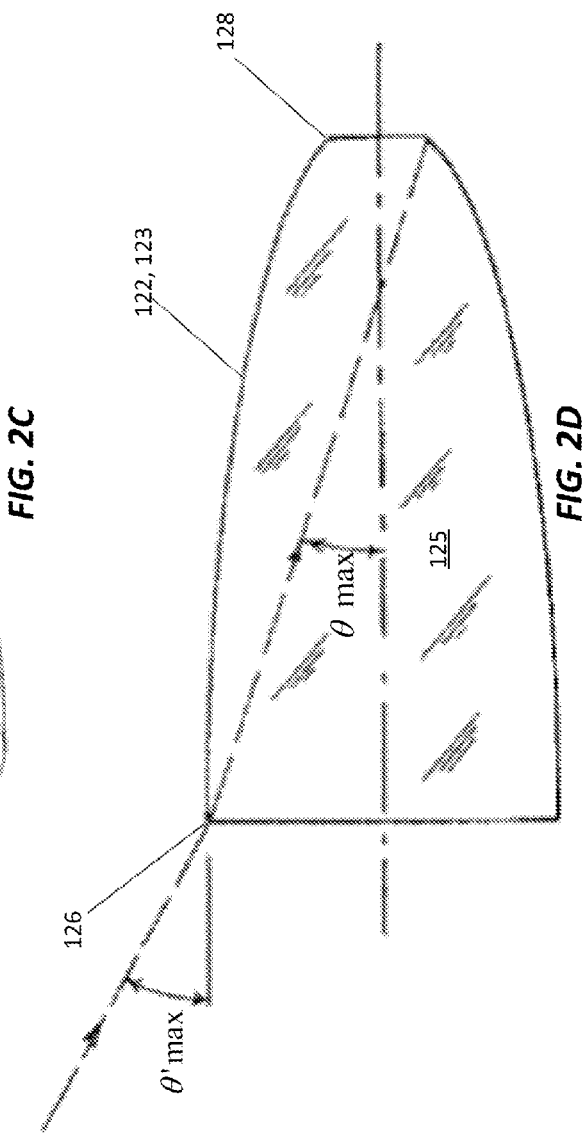

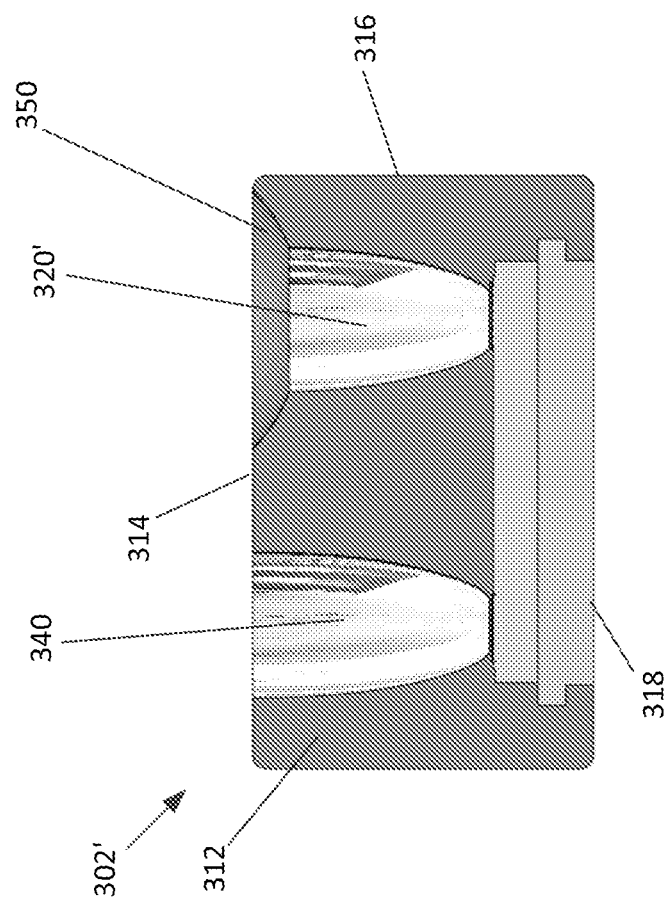

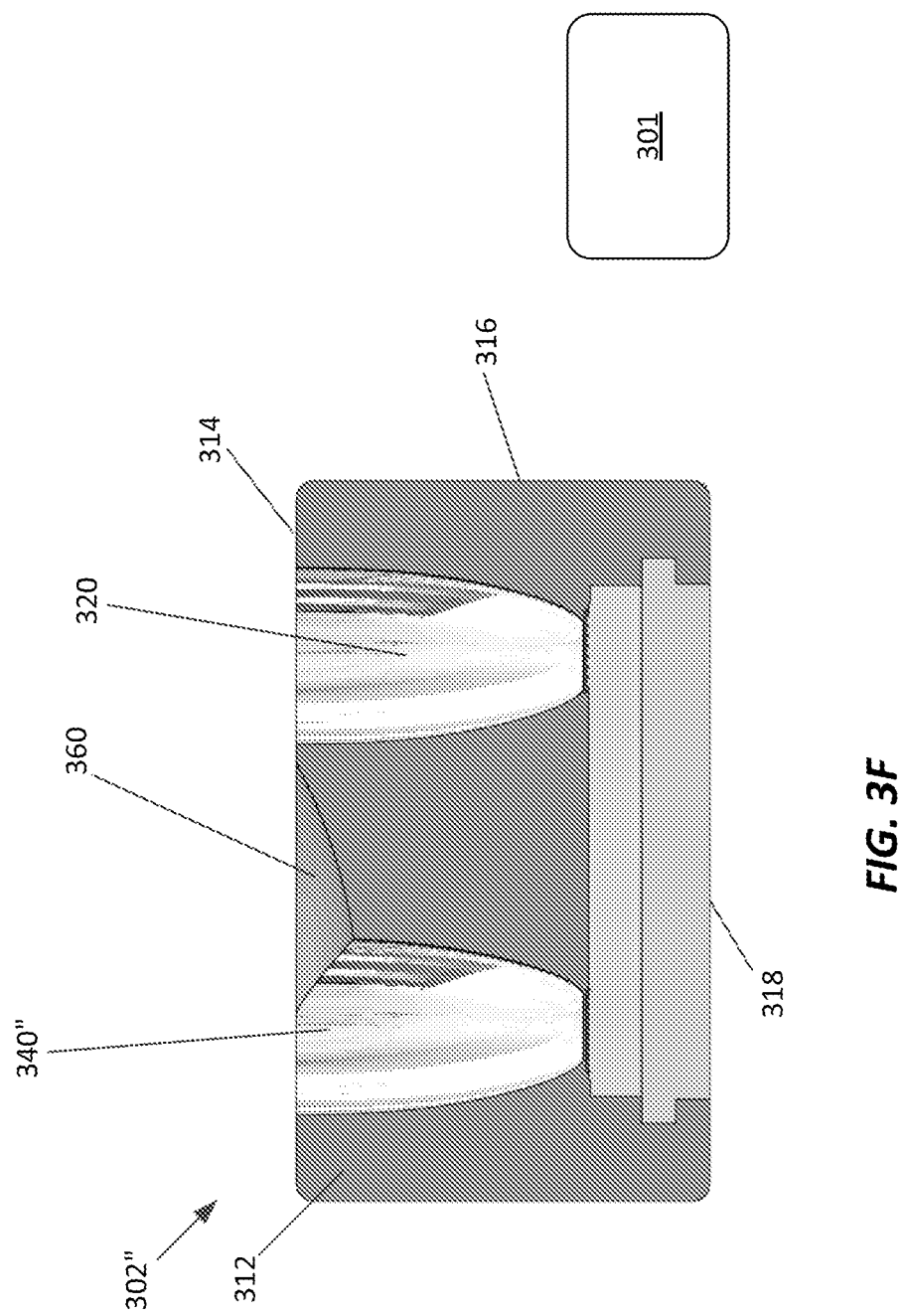

PACKAGED LIGHT DETECTOR SEMICONDUCTOR DEVICES WITH NON-IMAGING OPTICAL CONCENTRATORS FOR AMBIENT LIGHT AND/OR OPTICAL PROXMITY SENSING, METHODS FOR MANUFACTURING THE SAME, AND SYSTEMS INCLUDING THE SAME

PRIORITY CLAIM

This application claims priority under 35 U.S.C. 119(e) to U.S. Provisional Patent Application No. 61/730,692, which was filed Nov. 28, 2012.

BACKGROUND

Light detectors can be used, for example, as ambient light sensors or as part of optical proximity sensors. Since more and more light detectors are being integrated into devices, such as mobile phones, there is a desire to provide smaller and cheaper light detectors. Preferably, manufacturing of such light detectors should be relatively simple and should provide a high yield.

BRIEF DESCRIPTION OF THE DRAWINGS

FIG. 2A illustrates a profile of an exemplary compound parabolic concentrator (CPC) type of non-imaging optical concentrator.

FIG. 2B illustrates light rays entering an entrance aperture of a CPC at an extreme angle of acceptance and being directed to an edge of an exit aperture of the CPC.

FIG. 2C is a three-dimensional illustration of a CPC with a light ray entering the entrance aperture almost tangentially and reflecting many times around the interior of the CPC before emerging at the exit aperture.

FIG. 2D is used to illustrate that an extreme angle of acceptance for a CPC, and more generally, a non-imaging optical concentrator, can be increased by filling an inner volume of the non-imaging optical concentrator with a light transmissive material.

FIG. 3D shows a cross-sectional view of the PLDSD of FIG. 3C, along line D-D.

FIG. 3F shows a cross-sectional view of the PLDSD of FIG. 3E, along line F-F.

DETAILED DESCRIPTION

Figure 1A:
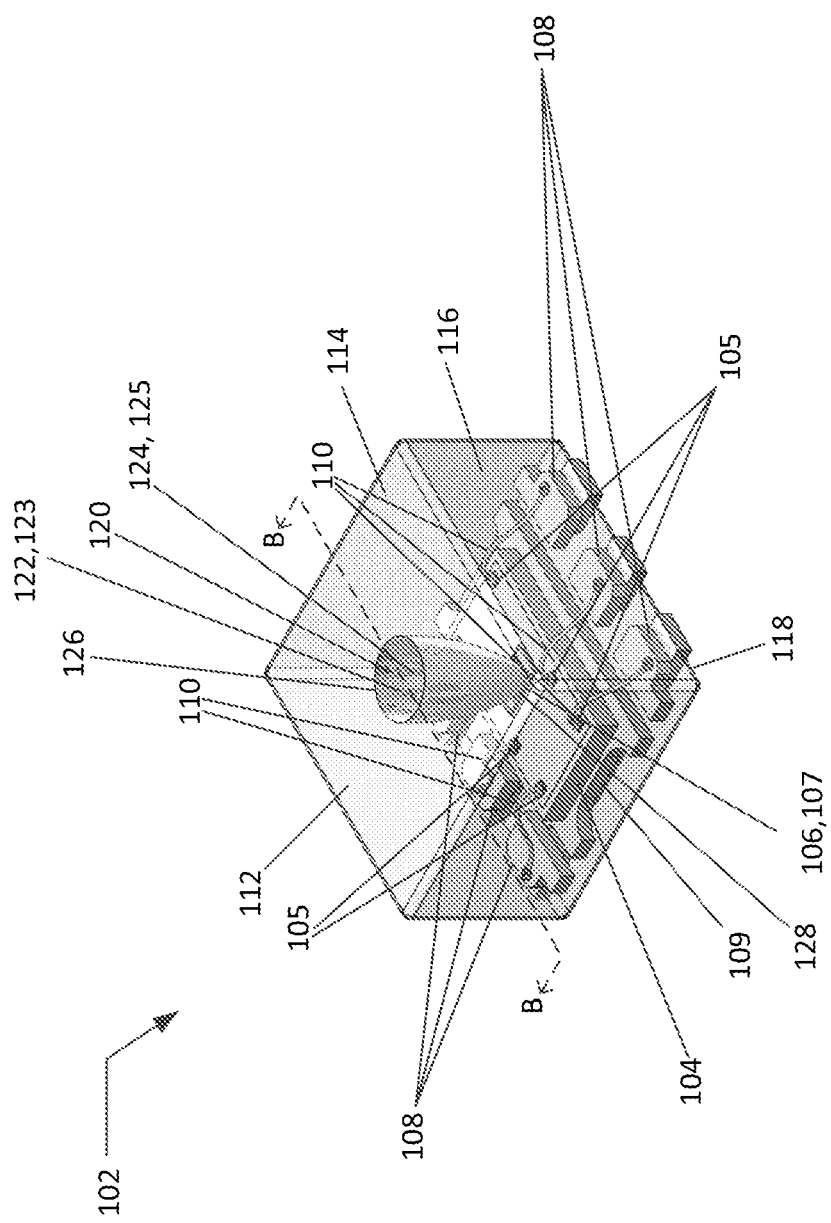
FIG. 1A shows a perspective view of a packaged light detector semiconductor device (PLDSD) according to an embodiment.
Figure 1B:
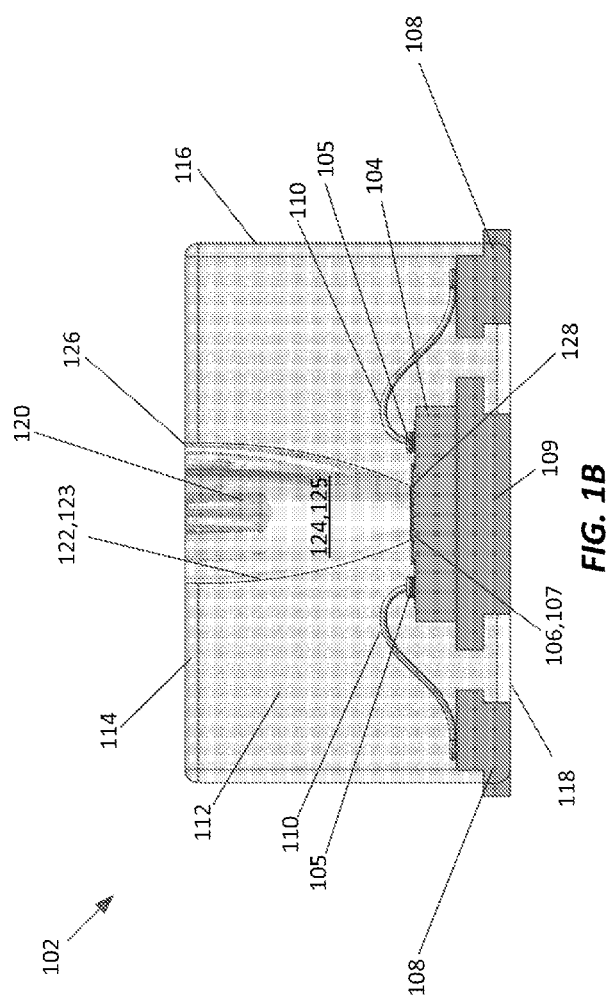
FIG. 1B shows a cross-sectional view of the PLDSD of FIG. 1A, along line B-B.
Figure 1C:
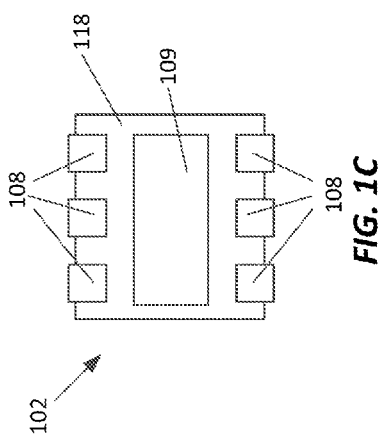
FIG. 1C shows a bottom view of the PLDSD of FIG. 1A.

FIG. 1A shows a perspective view of a packaged light detector semiconductor device (PLDSD) 102, according to an embodiment of the present invention. FIG. 1B shows a cross-sectional view of the PLDSD of FIG. 1A, along line B-B. FIG. 1C shows a bottom view of the PLDSD 102 of FIG. 1A. Referring to FIG. 1A, the PLDSD 102 is shown as including a light detector die 104 attached to a die attach paddle 109 and encapsulated within a molding material 112. In accordance with certain embodiments, the molding material 112 is an opaque molding material, such as, but not limited to, a black epoxy, or other opaque resin or polymer.

The light detector die 104 is shown as including an active light detector sensor region 106 used to produce a current or voltage indicative of the magnitude of detected light. The active light detector sensor region 106, which can also be referred to as the active photosensor region 106, includes one or more light detecting elements, each of which can be a photoresistor, a photovoltaic cell, a photodiode, a phototransistor, or a charge-coupled device (CCD), but is not limited thereto. Light detecting elements, such as those mentioned above, are examples of optoelectronic elements. The active photosensor region 106 is optionally covered by an optical filter 107 that absorbs and/or reflects at least some wavelengths of light before the light reaches the active photosensor region 106. For example, where the PLDSD 102 is intended to be used as an ambient light sensor (ALS), the optical filter 107 can be designed to absorb and/or reflect light of wavelengths outside of the visible spectrum, including, but not limited to, infrared (IR) light. For another example, where the PLDSD 102 is intended to be used as an optical proximity sensor (OPS) together with an IR light source, the optical filter 107 can be designed to absorb and/or reflect light of wavelengths other than IR light, in which case, the optical filter 107 can be designed to absorb and/or reflect light within the visible spectrum.

The light detector die 104 includes die contacts 105 that are electrically connected to lead-frame fingers 108 (which can be referred to more generally as package contacts 108) by bond wires 110. For example, one or more of the die contacts 105 can correspond to the anode(s) of the light detecting element(s) of the active photosensor region 106, while one or more further die contacts 105 can correspond to the cathode(s) of the light detecting element(s). The light detector die 104 can also include amplifier circuitry, filter circuitry and/or other types of signal processing circuitry, in which case one or more of the electrical contacts 105 can correspond to such signal processing circuitry.

The PLDSD 102 includes a top surface 114, a bottom surface 118 and a peripheral surface 116 extending between the top surface 114 and the bottom surface 118. In this example, the top surface 114 of the PLDSD 102 is formed by a top surface of the molding material 112, and the peripheral surface 116 is formed by the four sides of the molding material 112. The package contacts 108 can be, e.g., electrically conductive lands, electrically conductive pads, or electrically conductive balls, but are not limited thereto. For example, it is also possible that the package contacts 108 can be electrically conductive pins or wires. In this example, the PLDSD 102 includes six package contacts 108 and an exposed portion of the die attach paddle 109 on the bottom surface 118 (as best seen in FIG. 1C), however the PLDSD 102 can include more or less than six electrical connectors. The die attach paddle 109 can alternatively, or additionally, be a ground plane for the PLDSD 102. In accordance with an embodiment, the PLDSD 102 is a flat no-leads package. In accordance with a specific embodiment, the package contacts 108 form a land grid array.

The PLDSD 112 is shown as including a non-imaging optical concentrator 120 that collects and concentrates light for the active photosensor region 106. In FIGS. 1A and 1B the non-imaging optical concentrator 120 is shown as being a circular compound parabolic concentrator (CPC). In alternative embodiments, the non-imaging optical concentrator 120 can be a rectangular CPC or a square CPC. In other embodiments, the non-imaging optical concentrator 120 can be a circular, rectangular or square compound elliptic concentrator (CEC). In still other embodiments, the non-imaging optical concentrator 120 can be a circular, rectangular or square compound hyperbolic concentrator (CHC). Unless stated otherwise, for the remainder of this description, the non-imaging optical concentrator 120 will be assumed to be a circular CPC. However, as just explained, the use of alternative types of non-imaging optical concentrators, such as those mentioned above, are also within the scope of an embodiment.

In certain embodiments, a reflective material 123 is disposed on an inner surface 122 of the non-imaging optical concentrator 120 (e.g., a CPC). The reflective material 123 can be a reflective metal such as gold, silver, a gold-alloy or a silver-alloy, or adielectric material such as magnesium fluoride, or a combination thereof, but is not limited thereto.

The non-imaging optical concentrator 120 includes an entrance aperture 126 and an exit aperture 128, wherein the exit aperture 128 is smaller than the entrance aperture 126. The non-imaging optical concentrator 120 (e.g., a CPC) collects light radiation at its entrance aperture 126 and transfers that energy efficiently to its exit aperture 128. Substantially all radiant energy incident at the entrance aperture 126 and within a prescribed field-of-view (FOV) will be transferred to the smaller exit aperture 128. By locating the active photosensor region 106 under the exit aperture 128, the active photosensor region 106 receives substantially all of the radiant energy incident at the entrance aperture 126.

In certain embodiments, an inner volume 124 (which can also be referred to as a cavity) of the non-imaging optical concentrator 120 is hollow. In alternative embodiments, the inner volume 124 of the non-imaging optical concentrator 120 is filled with a light transmissive material 125, such as a light transmissive molding material. The light transmissive material 125 can be a light transmissive epoxy (e.g., a clear or tinted epoxy), or other light transmissive resin or polymer, but is not limited thereto. In certain embodiments, the light transmissive molding material 125 may have a pigment or other property that filters out (i.e., absorbs and/or reflects) light of certain wavelengths that are not of interest, while allowing light of wavelengths of interest to pass. A benefit of filling the non-imaging optical concentrator 120 with a light transmissive material 125 is that it prevents particles, such as dust particles, from getting into the non-imaging optical concentrator 120 and adversely affecting the sensitivity of the underlying active photosensor region 106. Another benefit of filling the non-imaging optical concentrator 120 with the light transmissive material 125 is that it can increase the maximum angle of acceptance, as discussed in additional details below with reference to FIG. 2D. In specific embodiments, a top surface of the light transmissive material 125 is flush with the top surface 124 of the molding material 112 within which the non-imaging optical concentrator 120 is molded. It is also within the scope of an embodiment that the non-imaging optical concentrator 120 is filled with multiple layers of different types of light transmissive material, having different indexes of refraction, so that the light transmissive material within the non-imaging optical concentrator 120 performs at least some optical filtering, in addition to, or in place of, the optical filter 107.

Where the non-imaging optical concentrator 120 is a CPC, the irradiance (W/m$^2$) will be multiplied (concentrated) by the ratio of the entrance-to-exit aperture areas. FIG. 2A illustrates the geometry of an exemplary CPC profile. The CPC profile is designed such that light rays entering the entrance aperture 126 at the extreme angle of acceptance, $\pm\theta_{max}$, will pass through the parabola focus point, which will form the edge of the exit aperture 128, as illustrated in FIG. 2A. The three-dimensional CPC is formed by rotating the parabola profile about the concentrator axis, not the parabola axis, as illustrated in FIG. 2A. FIG. 2B goes further to illustrate this point, showing many light rays entering the entrance aperture 126 of the CPC at the extreme angle of acceptance and being directed to the edge of the exit aperture 128. Light rays incident at the entrance aperture 126 at less than the extreme angle of acceptance ($\theta_{max}$) will emerge from the exit aperture 128 more toward the center of the aperture. While more complex, the operation of the CPC is essentially the same in three dimensions, as shown in FIG. 2C. In FIG. 2C, a light ray is shown entering the entrance aperture 126 almost tangentially and reflecting many times around the interior of the CPC before emerging at the exit aperture 128.

The defining equations for the design of a CPC are provided below. If the extreme angle of acceptance is $\theta_{max}$, and the diameter of the exit aperture is $2\alpha'$, then the focal length (f) of the parabola is given by $$f = \frac{\alpha'}{1 + \sin\theta_{max}}$$

The overall length is $$L = \frac{\alpha'(1 + \sin\theta_{max})\cos\theta_{max}}{\sin^2\theta_{max}}$$

And, the diameter of the entrance aperture is $$2\alpha = \frac{2\alpha'}{\sin\theta_{max}}$$

In a specific embodiment, the extreme angle of acceptance ($\theta_{max}$), which defines the FOV, was selected to be 22.7761°, and the exit aperture diameter ($2\alpha'$) was chosen as 0.2 mm. From the above equations, the entrance aperture diameter ($2\alpha$) is 0.5166 mm, and the length (L) is 0.8534 mm. The ratio of the areas of the entrance aperture 123 and the exit aperture 128 is 6.6719, which is the concentration factor for the CPC in this example.

Where the inner volume 124 is filled with the light transmissive material 125, the actual external extreme angle of acceptance ($\theta'_{max}$) for the CPC assembly will be the extreme angle of acceptance is ($\theta_{max}$) explained above, multiplied by the refractive index of the light transmissive material 124 (e.g., a clear epoxy material), 1.5367 for example. Thus, the FOV for the CPC assembly in this example will be ±35°. In other words, filling the inner volume 124 with a light transmissive material 125 having a refractive index that is greater than one (i.e., >1) increases the extreme angle of acceptance from $\theta_{max}$ to $\theta'_{max}$, as illustrated in FIG. 2D.

The use of the non-imaging optical concentrator 120 enables the active photosensor region 106 and the entire package to be reduced in size. For example, to achieve a predetermined sensitivity, the use of the non-imaging optical concentrator 120 enables the active photosensor region 106 to be reduced to about one-third the area that would be required if a non-imaging optical concentrator (and specifically, a CPC) were not used.

If the area of the active photosensor region 106 were much larger than the area of exit aperture 128, then a large area of the active photosensor region 106 would be wasted because it would not be responsive to incident light. If the area of the active photosensor region 106 were smaller than the area of the exit aperture 128, than some of the light that reached the exit aperture 128 would not be incident on the active photosensor region 106. Accordingly, in certain embodiments, an area of the exit aperture 128 is substantially the same as or smaller than an area of the active photosensor region 106 so that substantially all of the light that reaches the exit aperture 128 is directed toward the active photosensor region 106. In specific embodiments, an area of the exit aperture 128 and an area of the active photosensor region 106 are within 20% of one another. For example, an area of the active photosensor area 106 is within the range of 100% to 120% of the area of the exit aperture 128.

Since the volume external to the non-imaging optical concentrator 120 does not contribute to the photosensor irradiance, the molding material 112 does not need to be a light transmissive optical-grade material. Indeed, the molding material 112 may be completely opaque. A benefit of the molding material 112 being opaque is that the underlying active photosensor region 106 is only responsive to light that has entered the non-imaging optical concentrator 120 through the entrance aperture 126.

In accordance with specific embodiments of the present invention, the PLDSD 102 is for use as an ambient light sensor (ALS), and thus, can alternatively be referred to as an ALS. When used as an ALS, because of the inclusion of the non-imaging optical concentrator 120, the area of the active photosensor region 106 of the PLDSD 102 can be reduced by more than 2-to-1 compared to conventional packages, while the average irradiance on the active photosensor region can be increased by almost 5-to-1, and the peak irradiance can be increased by more than 10-to-1. Alternatively, the PLDSD 102 can be used, along with a light source, as part of an optical proximity sensor (OPS).

Figure 3A:
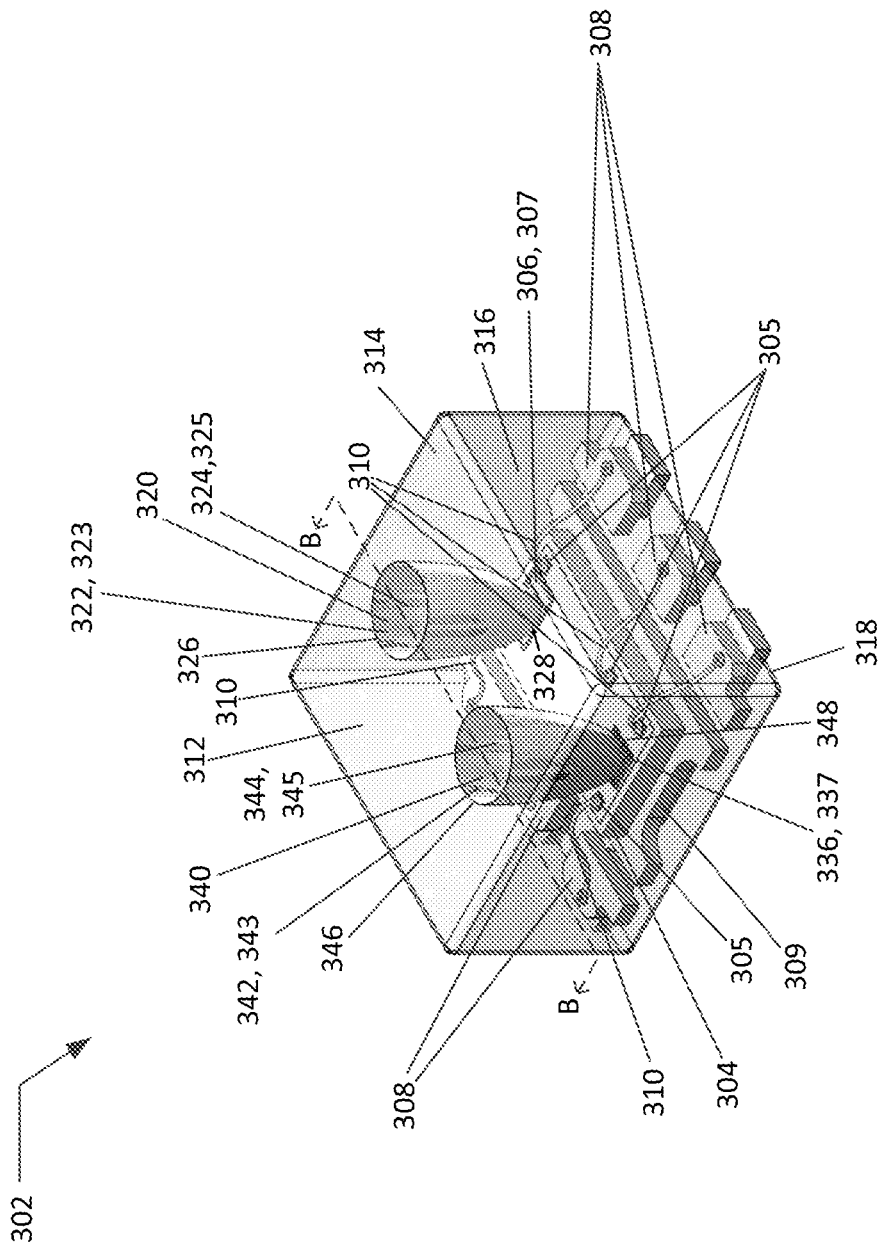
FIG. 3A shows a perspective view of a PLDSD according to a further embodiment.
Figure 3B:
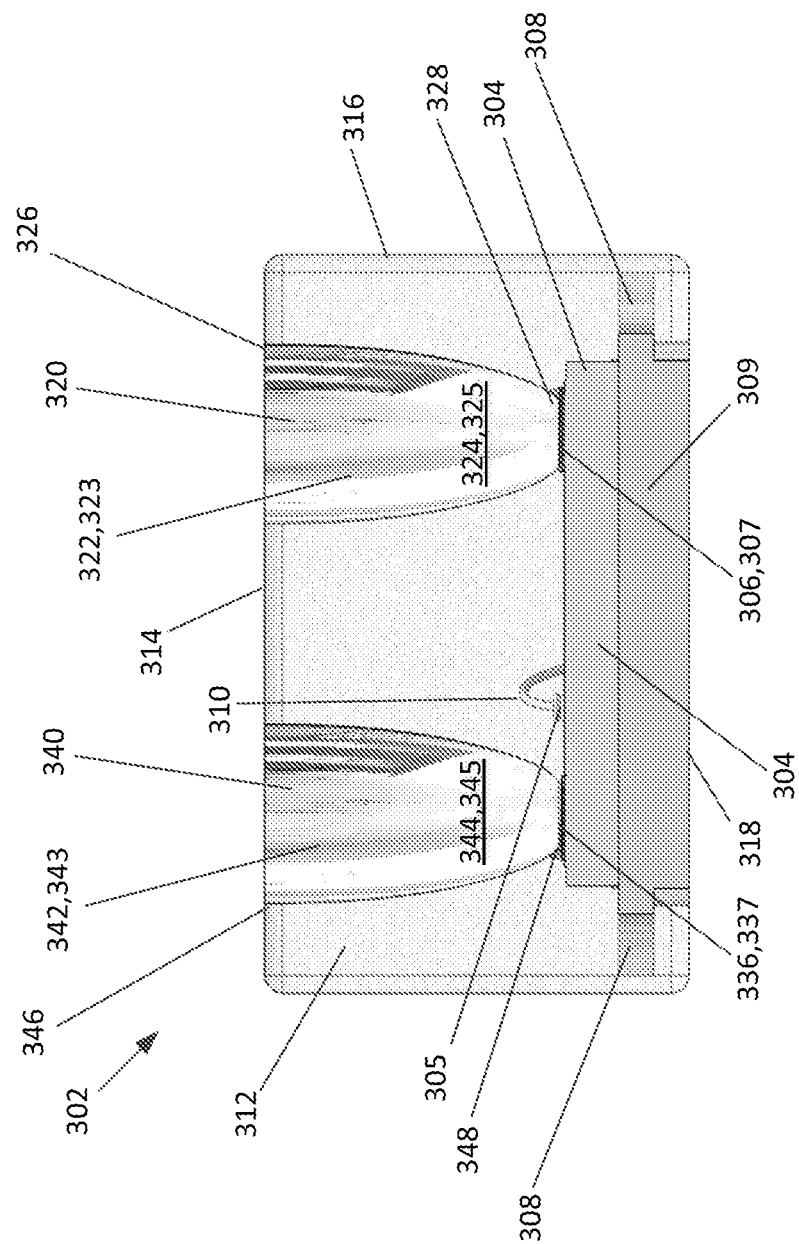
FIG. 3B shows a cross-sectional view of the PLDSD of FIG. 3A, along line B-B.

FIG. 3A shows a perspective view of a PLDSD according to a further embodiment. FIG. 3B shows a cross-sectional view of the PLDSD of FIG. 3A, along line B-B. In this embodiment, a light detector die 304 includes two active photosensor regions 306 and 336, one of which is for use as an ALS, and the other one of which is for use with a light source as part of an OPS. For this discussion, it will be assumed that the active photosensor region 306 is for an ALS, and the active photosensor region 336 is for use as part of an OPS. The light detector die 304 is encapsulated within a molding material 312, which can be an opaque molding material, such as, but not limited to, a black epoxy, or other opaque resin or polymer.

Each active photosensor region 306, 336, which is used to produce a corresponding current or voltage indicative of the magnitude of respective detected light, includes one or more light detecting elements, examples of which were described above. The active photosensor region 306 is optionally covered by an optical filter 307 that absorbs and/or reflects wavelengths outside of the visible spectrum, including, but not limited to, IR light. The active photosensor region 336 is optionally covered by an optical filter 337 designed to absorb and/or reflect light of wavelengths other than IR light, in which case, the optical filter 337 can be designed to absorb and/or reflect light within the visible spectrum.

The light detector die 304 includes die contacts 305 that are connected to lead-frame fingers 308 (which can be referred to more generally as package contacts 308) by bond wires 310. The light detector die 304 can also include amplifier circuitry, filter circuitry and/or other types of signal processing circuitry.

The PLDSD 302 includes a top surface 314, a bottom surface 318 and a peripheral surface 316 extending between the top surface 314 and the bottom surface 318. In this example, the top surface 314 of the PLDSD 302 is formed by a top surface of the molding material 312, and the peripheral surface 316 is formed by the four sides of the molding material 312. The package contacts 308 can be, e.g., electrically conductive lands, electrically conductive pads, electrically conductive balls, electrically conductive pins, or wires, but are not limited thereto. In this example, the PLDSD 302 includes six package contacts 308 and an exposed portion of die attach paddle 309 on the bottom surface 318, however the PLDSD 302 can include more or less than six electrical connectors. The die attach paddle 309 can alternatively, or additionally, be a ground plane for the PLDSD 302. In accordance with an embodiment, the PLDSD 302 is a flat no-leads package. In accordance with a specific embodiment, the package contacts 308 form a land grid array.

The PLDSD 302 is shown as including a first non-imaging optical concentrator 320 that collects and concentrates light for the active photosensor region 306, and a second non-imaging optical concentrator 340 that collects and concentrates light for the active photosensor region 336. In FIGS. 3A and 3B each of the non-imaging optical concentrators 320, 340 is shown as being a CPC, but can alternatively be another type of non-imaging optical concentrator, such as a CEC or CHS. It is also possible that two different types of non-imaging optical concentrators are used, e.g., the non-imaging optical concentrator 320 can be a circular CPC, while the non-imaging optical concentrator 340 can be a square CEC. In certain embodiments, a reflective material 323 is disposed on an inner surface 322 of the non-imaging optical concentrator 320, and a reflective material 343 is disposed on an inner surface 342 of the non-imaging optical concentrator 340. Exemplary types of reflective materials were discussed above with reference to FIGS. 1A and 1B. The non-imaging optical concentrator 320 includes an entrance aperture 326 and an exit aperture 328. Similarly, the non-imaging optical concentrator 340 includes an entrance aperture 346 and an exit aperture 348. An inner volume 324 (which can also be referred to as a cavity) of the non-imaging optical concentrator 320 can be hollow, or can be filled with a light transmissive material 325. Similarly, an inner volume 344 of the non-imaging optical concentrator 340 can be hollow, or can be filled with a light transmissive material 345. Exemplary types of light transmissive materials were discussed above with reference to FIGS. 1A and 1B, as were benefits of filling the inner volume of a non-imaging optical concentrator with such a material.

Figure 3C:
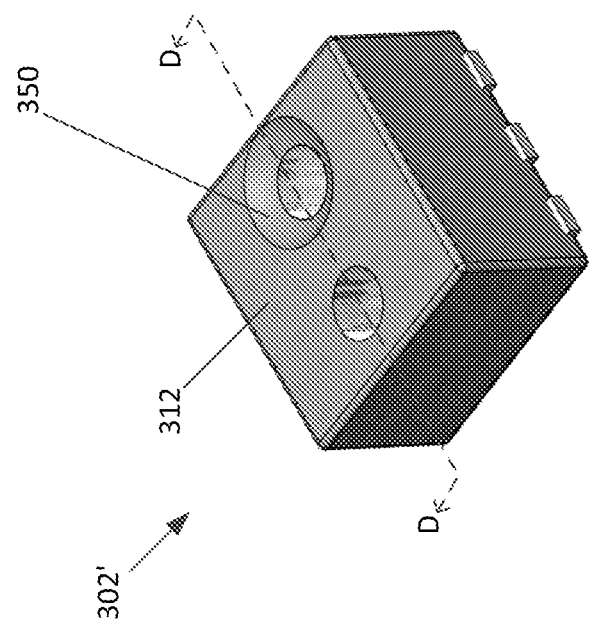
FIG. 3C shows a perspective view of a PLDSD according to another embodiment.

FIG. 3C shows a perspective view of a PLDSD 302' according to another embodiment. FIG. 3D shows a cross-sectional view of the PLDSD of FIG. 3C, along line D-D. The PLDSD 302' of FIGS. 3C and 3D is similar to the PLDSD 302 described with reference to FIGS. 3A and 3B, except that a recess 350 is added in the molding material 312, which enables a non-imaging optical concentrator 320' below the recess 350 to have a shorter length than the non-imaging optical concentrator 340 without the recess 350. For example, the recess 350 enables the non-imaging optical concentrator 320' for use as part of an ALS to be shorter in length than the non-imaging optical concentrator 340 for use as part of an OLS. More generally, the recess 350 enables a single PLDSD to include non-imaging optical concentrators of different lengths.

Figure 3E:
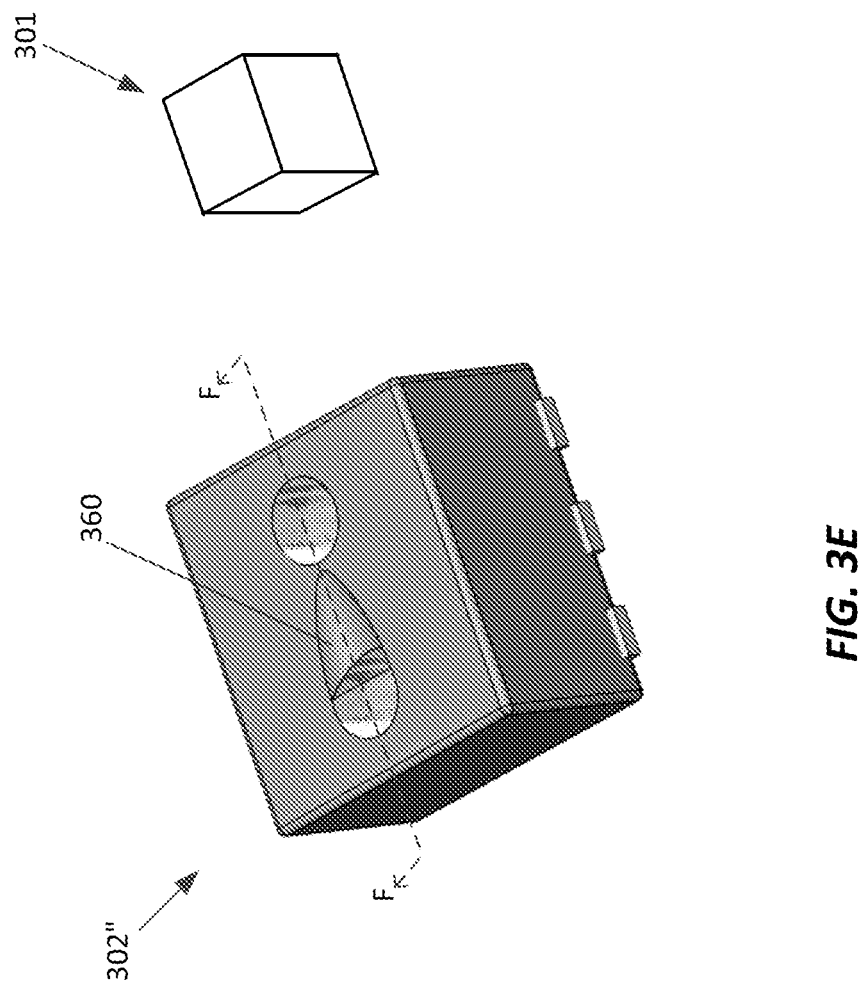
FIG. 3E shows a perspective view of a PLDSD according to still another embodiment.

FIG. 3E shows a perspective view of a PLDSD 302" according to another embodiment. FIG. 3F shows a cross-sectional view of the PLDSD of FIG. 3E, along line F-F. The PLDSD 302" of FIGS. 3E and 3F is similar to the PLDSD 302 described with reference to FIGS. 3A and 3B, except that a light directing baffle 360 is added in the molding material 312, which enables the FOV for one of the non-imaging optical concentrators (labeled 340") to be increased in the direction of a light source 301 (e.g., an IR LED) that is used as part of the OPS. More generally, a light directing baffle 360 can be used to increase the FOV for a non-imaging optical concentrator. It is also within the scope of an embodiment for a single PLDSD to include both a recess (the same as, or similar to, the recess 350) and a light directing baffle (the same as, or similar to, the light directing baffle 360). For example, a recess can be located above the non-imaging optical concentrator that concentrates light for an active photosensor region used as an ALS, and a light directing baffle can be used with the non-imaging optical concentrator that concentrates light for an active photosensor region used as part of an OPS.

In the above description, and the previously described FIGS., the light detector dies 104 and 304 were described and shown as being attached to die paddles of a lead-frame. In alternative embodiments, portions of bottom surfaces of the dies 104 and 304 can be attached directly to portions of top surfaces of lead-fingers of a lead-frame not having a die paddle, as is the case with Chip-on-Lead (CoL) packages. In other embodiments, bottom surfaces of the light detector dies 104 and 304 can be attached directly to the top surface of a printed circuit board (PCB), as is the case with Chip-on-PCB packages. In other words, bottom surfaces of the dies 104 and 304 can be attached to top surfaces of various types of package substrates, including lead-frames (which may or may not include die paddles) and PCBs, but are not limited thereto. In all such embodiments, wire bonds can be used to electrically connect die contacts (of the dies 104 and 304) to package contacts (of the package substrates), wherein the package contacts are used to electrically connect the resulting PLDSDs to external circuitry. Through silicon vias (TSVs) can be used in place of, or in addition to, wire bonds. In further embodiments, the active sensor regions(s) can be located on the backside of a die, and flip chip bonding technology can be used to electrically connect die contacts to package contacts.

Figure 4:
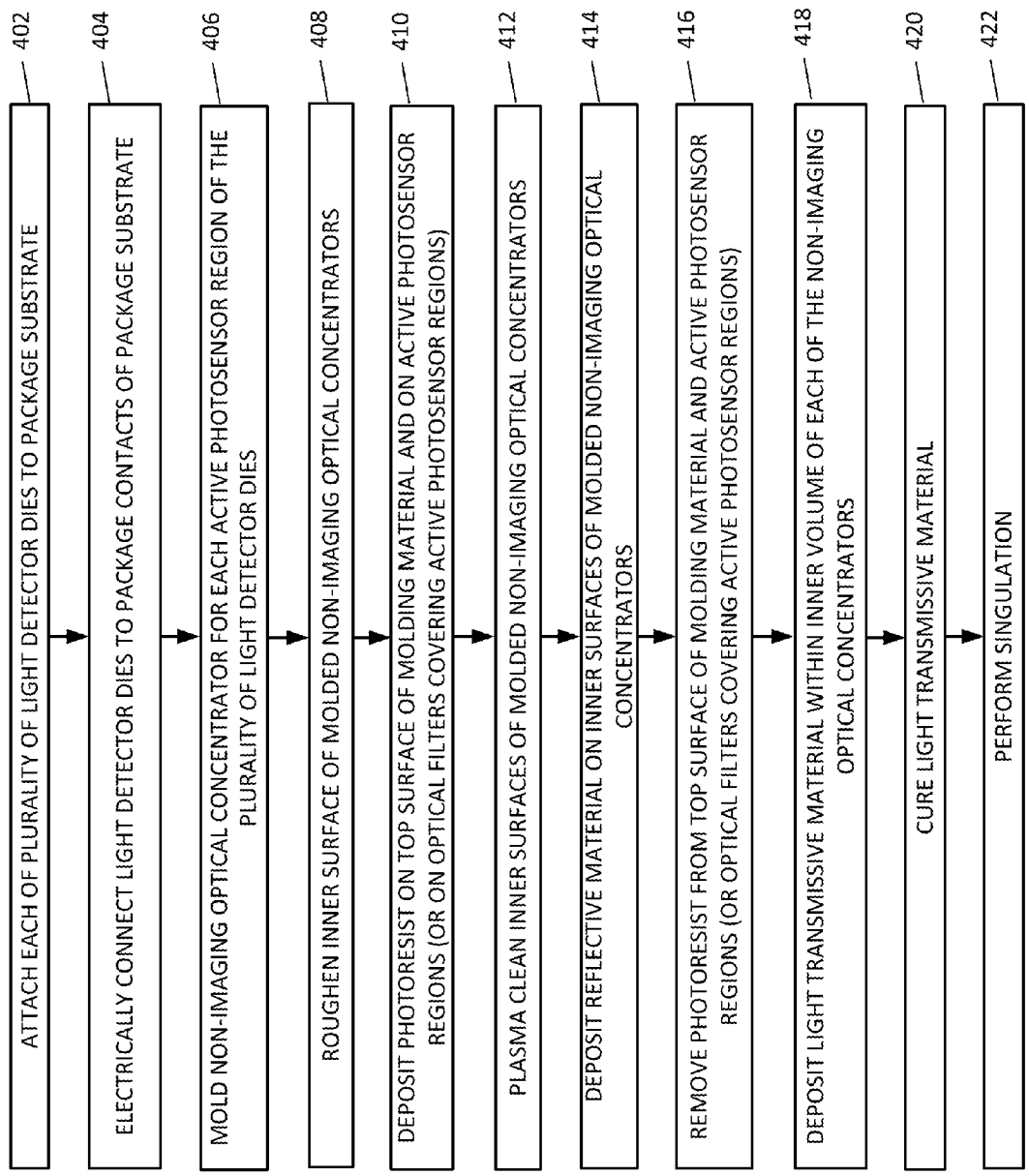
FIG. 4 is a high level flow diagram that is used to summarize methods for manufacturing PLDSDs in accordance with various embodiments.

FIG. 4 is a high level flow diagram that is used to summarize methods for manufacturing PLDSDs in accordance with various embodiments. Referring to FIG. 4, at step 402, each of a plurality of the light detector dies (e.g., 104 or 304) is attached to a package substrate. This can be accomplished by attaching bottom surfaces of the dies to die paddles of a lead-frame using an adhesive. Alternatively, bottom surfaces of the dies can be attached directly to portions of top surfaces of lead-frame fingers. In still other embodiments, bottom surfaces of dies can be attached to a PCB.

At step 404, the light detector dies (and more specifically, contacts of the dies) are electrically connected to package contacts of the package substrate. The package contacts of the package substrate can be, e.g., lead-frame fingers of a lead-frame, or wire bond pads of a PCB, but are not limited thereto. Step 404 can be performed using wire bonding, as was explained above. Alternatively, TSVs can be used in place of wire bonds. In further embodiments, the active sensor regions(s) can be located on the backside of a die, and flip chip bonding technology can be used to electrically connect die contacts to package contacts.

At step 406, molding is performed to mold, from a molding material (e.g., 112, 312), one or more non-imaging optical concentrator (e.g., 120, 320, 320', 340, 340") for each active photosensor region of the plurality of light detector dies. As was described above, each non-imaging optical concentrator includes an entrance aperture and an exit aperture axially aligned with one another and with an active photosensor region of the underlying light detector die. In specific embodiments, the molding material used at step 406 is an opaque molding material, such as, but not limited to, a black epoxy, or other opaque resin or polymer. In addition to being used to form the non-imaging optical concentrators, the molding material also encapsulates portions of the upper surfaces of the light detector dies that extend beyond the exit apertures of the non-imaging optical concentrators. At step 406, recesses (e.g., 350) and/or light directing baffles (e.g., 360), which were described above, can also be molded. In accordance with specific embodiments, transfer molding is performed at step 406. In alternative embodiments, other types of molding techniques can be used, including, but not limited to, compression molding, casting and injection molding.

At step 408, inner surfaces of the molded non-imaging optical concentrators are roughened, e.g., using an Argon-Oxygen plasma etch, so that a reflective material (deposited at step 414) will adhere to the inner surfaces.

At step 410, a sacrificial photoresist is deposited on the surface of an upper surface of the molded structure that results from step 406, and within the exit apertures of the non-imaging optical concentrators so that the sacrificial photoresist covers the active sensor regions, or optical filters covering the active sensor regions. This sacrificial photoresist is used to enable excess reflective material (deposited at step 414) to be removed at a later step (at step 416).

At step 412, inner surfaces of the non-imaging optical concentrators are plasma cleaned to remove debris (that may remain from the roughening performed at step 408) and/or remove excess photoresist (that may have been inadvertently deposited on the inner surfaces of the non-imaging optical concentrators at step 410).

At step 414, a reflective material (e.g., 123, 323, 343) is deposited on the inner surfaces of the non-imaging optical concentrators. As mentioned above, the reflective material can be a reflective metal such as gold, silver, a gold-alloy or a silver-alloy, or a dielectric material such as magnesium fluoride, or a combination thereof, but is not limited thereto.

At step 416, the sacrificial photoresist (deposited at step 410) is removed, e.g., using a photoresist stripper.

At step 418, a light transmissive material (e.g., 125, 325, 345) is deposited within inner volumes of the non-imaging optical concentrators, thereby filling at least a portion of the inner volume of each of the non-imaging optical concentrators. As mentioned above, the light transmissive material can be a light transmissive epoxy (e.g., a clear or tinted epoxy), or other light transmissive resin or polymer, but is not limited thereto. In specific embodiments, a top surface of the light transmissive material deposited at step 416 is flush with the top surface of the molding material used to mold the non-imaging optical concentrators at step 406.

At step 420, the light transmissive material is cured. For example, the light transmissive material can be thermal cured within an oven heated to a temperature, e.g., between 90 and 110 degrees Celsius, depending on the specific light transmissive material used. Other ways of curing the light transmissive material can be used, including, but not limited to, using ultraviolet (UV) radiation.

At step 422, singulation is performed to thereby separate the package substrate and molding material into a plurality of separate PLDSDs each of which includes one of the light detector dies and one or more non-imaging optical concentrators that is/are at least partially filled with the light transmissive molding material. Exemplary resulting PLDSDs include the PLDSDs 102, 302, 302' and 302" described above.

In the above described embodiments, already segmented dies were described as being attached to a package substrate (at step 402), die contacts were electrically connected to package contacts of the package substrate (at step 404), and non-imaging optical concentrators were thereafter molded (at step 406). In alternative embodiments, the non-imaging optical concentrators can be molded right on a wafer that is not segmented into separate dies until the final singulation is performed (at step 422). Such alternative embodiments provide for a full chip-scale packaging process in which TSVs can be used to provide electrical connections between an active side of each die and the other side of each die.

Figure 5:
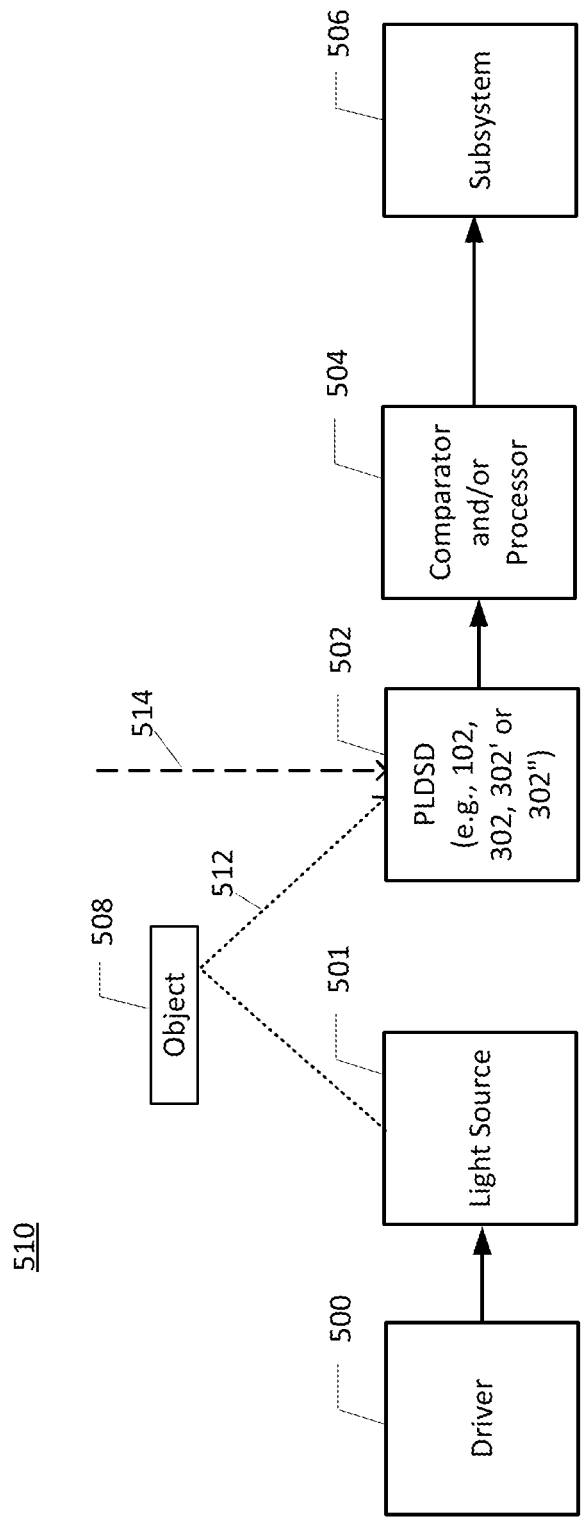
FIG. 5 is a high level block diagram of a system that includes a PLDSD according to an embodiment.

FIG. 5 is a high level block diagram of a system 510 that includes a PLDSD according to an embodiment. PLDSDs of embodiments of the present invention can be used in various systems, including, but not limited to, mobile phones, tablets, personal data assistants, laptop computers, netbooks, other handheld-devices, as well as non-handheld-devices. Referring to the system 510 of FIG. 5, for example, a PLDSD 502 (e.g., which can be one of the PLDSDs 102, 302, 302' or 302") can be used to control whether a subsystem 506 (e.g., a touch-screen, display, backlight, virtual scroll wheel, virtual keypad, navigation pad, etc.) is enabled or disabled, and/or to determine whether to adjust (e.g., a brightness associated with) the subsystem 506. For example, where the PLDSD 502 includes an active photosensor region that is used together with a light source 501 (e.g., an IR light emitting diode) as an OPS, the PLDSD 502 can be used detect when an object 508, such as a person's finger, is approaching, and based on the detection either enable (or disable) the subsystem 506. For example, an output of the PLDSD 502 can be provided to a comparator and/or processor 504 which can, e.g., compare the output of the PLDSD to one or more threshold, to determine whether the object 508 is within a range where the subsystem 506 should be enabled (or disabled, depending on what is desired). Multiple thresholds (e.g., stored digital values) can be used, and more than one possible response can occur based on the detected proximity of the object 508. For example, a first response can occur if the object 508 is within a first proximity range, and a second response can occur if the object 508 is within a second proximity range. Exemplary responses can include starting or stopping, or otherwise adjusting the subsystem 506.

Alternatively, or additionally, the PLDSD 502 can include an active photosensor region that is used as an ALS. For example, an output of the PLDSD 502 can be provided to the comparator and/or processor 504, which can determine how to adjust the brightness of the subsystem 506 (e.g., a display or backlight). FIG. 5 also shows that a driver 500 can be used selectively drive one or more light emitting elements of the light source 501.

In FIG. 5, the dotted line 512 represents light that originated from the light source 501, reflected off an object 508, and is detected by an active photosensor region of the PLDSD 502 that is used together with the light source 512 as an OPS. In FIG. 5, the dashed line 514 represents ambient light that is detected by an active photosensor region of the PLDSD 502 that is used as an ALS. As was described in additional detail above, in accordance with specific embodiments, one or more non-imaging optical concentrator can be used to collect and concentrate the light 512 and/or 514 for one or more active photosensor regions of the PLDSD 502.

Embodiments of the present invention have been described above with the aid of functional building blocks illustrating the performance of specified functions and relationships thereof. The boundaries of these functional building blocks have often been defined herein for the convenience of the description. Alternate boundaries can be defined so long as the specified functions and relationships thereof are appropriately performed. Any such alternate boundaries are thus within the scope and spirit of the claimed invention.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A packaged light detector semiconductor device, comprising:
   a light detector die having a surface including an active photosensor region;
   a non-imaging optical concentrator including an entrance aperture and an exit aperture axially aligned with one another and with the active photosensor region; and
   a molding material that forms the non-imaging optical concentrator and encapsulates at least a portion of the surface of the light detector die that extends beyond the exit aperture of the non-imaging optical concentrator.

2. The device of claim 1, wherein:
   the active photosensor region is adjacent the exit aperture of the non-imaging optical concentrator; and
   the entrance aperture and the exit aperture of the non-imaging optical concentrator are separated by an axial distance that is substantially equal to an axial distance between the entrance aperture and the active photosensor region.

3. The device of claim 1, wherein:
   the non-imaging optical concentrator is adapted to concentrate light from the entrance aperture toward the exit aperture and onto the active photosensor region.

4. The device of claim 3, further comprising:
   an optical filter between the active photosensor region and the exit aperture of the non-imaging optical concentrator;
   wherein the optical filter is adapted to at least one of absorb or reflect at least some wavelengths of light before the light reaches the active photosensor region.

5. The device of claim 1, further comprising:
   a reflective material disposed on an inner surface of the non-imaging optical concentrator.

6. The device of claim 1, wherein:
   the molding material, that forms the non-imaging optical concentrator and encapsulates at least a portion of the first surface of the light detector die that extends beyond the exit aperture of the non-imaging optical concentrator, comprises an opaque molding material; and
   further comprising a light transmissive molding material that fills at least a portion of an inner volume of the non-imaging optical concentrator.

7. The device of claim 6, wherein the light transmissive molding material fills the inner volume of the non-imaging optical concentrator such that a top surface of the opaque molding material and a top surface of the light transmissive molding material are substantially flush with one another.

8. The device of claim 1, wherein the non-imaging optical concentrator comprises a compound parabolic concentrator (CPC).

9. The device of claim 1, further comprising:
die contacts on the light detector die;
package contacts remote from the light detector die; and
bond wires that electrically connect the die contacts on the light detector die to the package contacts remote from the light detector die;
wherein the molding material, that forms the non-imaging optical concentrator and encapsulates portions of the first surface of the light detector die that extend beyond the exit aperture of the non-imaging optical concentrator, also encapsulates the die contacts, the bond wires and at least a portion of the package contacts.

10. The device of claim 1, wherein:
an area of the exit aperture is substantially the same as or smaller than an area of the active photosensor region so that substantially all of the light that reaches the exit aperture is directed toward the active photosensor region.

11. The device of claim 1, wherein an area of the exit aperture and an area of the active photosensor region are within 20% of one another.

12. The device of claim 1, further comprising:
a second active photosensor region; and
a second non-imaging optical concentrator including a second entrance aperture and a second exit aperture axially aligned with one another and with the second active photosensor region;
wherein the surface of the light detector die includes both the active photosensor region and the second active photosensor region, which are spaced apart from one another;
wherein the molding material forms both the non-imaging optical concentrator and the second non-imaging optical concentrator and encapsulates portions of the surface of the light detector die that extend beyond the exit aperture of the non-imaging optical concentrator and the second exit aperture of the second non-imaging optical concentrator; and
wherein one of the active photosensor regions is for use as an ambient light sensor, and the other one of the active photosensor regions is for use as part of an optical proximity sensor.

13. A method for manufacturing a packaged light detector semiconductor device that comprises a light detector die having a surface including an active photosensor region, the method comprising:
(a) molding, from a molding material, a non-imaging optical concentrator including an entrance aperture and an exit aperture axially aligned with one another and with the active photosensor region; and
(b) encapsulating, with the molding material, at least a portion of the surface of the light detector die that extends beyond the exit aperture of the non-imaging optical concentrator.

14. The method of claim 13, wherein steps (a) and (b) are simultaneously performed.

15. The method of claim 13, further comprising:
(c) depositing a reflective material on an inner surface of the non-imaging optical concentrator.

16. The method of claim 15, further comprising:
(d) filling at least a portion of an inner volume of the non-imaging optical concentrator with a further molding material, wherein the further molding material is light transmissive.

17. The method of claim 16, wherein:
a surface of the light detector die also includes a second active photosensor region;
step (a) also comprises molding, from the molding material, a second non-imaging optical concentrator including a second entrance aperture and a second exit aperture axially aligned with one another and with the second active photosensor region; and
step (b) includes encapsulating, with the molding material, portions of the surface of the light detector die that extend beyond the exit aperture of the non-imaging optical concentrator and the second exit aperture of the second non-imaging optical concentrator; and
wherein one of the active photosensor regions is for use as an ambient light sensor, and the other one of the active photosensor regions is for use as part of an optical proximity sensor.

18. A method for manufacturing a plurality of packaged light detector semiconductor devices each of which comprises a light detector die including at least one active photosensor region, the method comprising:
(a) attaching each of a plurality of the light detector dies to a package substrate;
(b) electrically connecting the light detector dies to package contacts of the package substrate;
(c) molding, from a molding material, at least one non-imaging optical concentrator for each light detector die of the plurality of light detector dies, wherein each non-imaging optical concentrator includes an entrance aperture and an exit aperture axially aligned with one another and with an active photosensor region of one of the light detector dies;
(d) depositing a reflective material on an inner surface of each of the non-imaging optical concentrators;
(e) filling at least a portion of an inner volume of each of the non-imaging optical concentrators with a further molding material, wherein the further molding material is light transmissive; and
(f) performing singulation to thereby separate the package substrate and molding material into a plurality of separate packaged light detector semiconductor devices each of which comprises one of the light detector dies and a corresponding non-imaging optical concentrator that is at least partially filled with the light transmissive further molding material.

19. A system, comprising:
a packaged light detector semiconductor device configured to produce an output signal indicative of detected light; and
a subsystem that is at least one of enabled, disabled or adjusted in dependence on the output signal produced by the packaged light detector semiconductor device;
wherein the packaged light detector semiconductor device includes a light detector die having a surface including an active photosensor region;
a non-imaging optical concentrator including an entrance aperture and an exit aperture axially aligned with one another and with the active photosensor region; and
a molding material that forms the non-imaging optical concentrator and encapsulates at least a portion of the surface of the light detector die that extends beyond the exit aperture of the non-imaging optical concentrator.

20. The system of claim 19, further comprising:
at least one of a comparator or a processor configured to
- perform a comparison of the output signal, indicative of detected light, to one or more thresholds, and
- at least one of enable, disable or adjust the subsystem based on results of the comparison.

* * * * *